United States Patent
Park et al.

(10) Patent No.: US 7,622,761 B2
(45) Date of Patent: Nov. 24, 2009

(54) NON-VOLATILE MEMORY DEVICE AND METHOD OF MANUFACTURING THE SAME

(75) Inventors: Yoon-Dong Park, Yongin-si (KR); Won-Joo Kim, Hwaseong-si (KR); June-Mo Koo, Seoul (KR); Suk-Pil Kim, Yongin-si (KR); Jae-Woong Hyun, Uijeongbu-si (KR); Jung-Hoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 161 days.

(21) Appl. No.: 11/723,222

(22) Filed: Mar. 19, 2007

(65) Prior Publication Data

US 2007/0284648 A1 Dec. 13, 2007

(30) Foreign Application Priority Data

Mar. 17, 2006 (KR) .................. 10-2006-0024903
Nov. 15, 2006 (KR) .................. 10-2006-0113041

(51) Int. Cl.
*H01L 29/76* (2006.01)
(52) U.S. Cl. .................. 257/314; 257/315; 257/317; 438/151; 438/257
(58) Field of Classification Search .................. 257/314, 257/315, 317, 318, E29.17; 438/151, 257
See application file for complete search history.

(56) References Cited

U.S. PATENT DOCUMENTS 6,432,812 B1 * 8/2002 May .......................... 438/619
6,778,441 B2 * 8/2004 Forbes et al. ............ 365/185.26
7,009,272 B2 * 3/2006 Borger et al. ................ 257/522

(Continued)

FOREIGN PATENT DOCUMENTS

EP 1 923 908 A2 5/2008

(Continued)

OTHER PUBLICATIONS

International search report dated Dec. 30, 2008, for counterpart Application No. 07103437.5.

*Primary Examiner*—Phuc T Dang
(74) *Attorney, Agent, or Firm*—Harness, Dickey & Pierce, P.L.C.

(57) ABSTRACT

The non-volatile memory device may include a semiconductor substrate having a body and a pair of fins. A bridge insulating layer may non-electrically connect upper portions of the pair of fins to define a void between the pair of fins. Outer surfaces of the pair of fins are the surfaces of the pair of fins that do not face the void and inner surfaces of the pair of fins are the surfaces of the pair of fins that do face the void. The non-volatile memory device may further include at least one control gate electrode that may cover at least a portion of outer surfaces of the pair of fins, may extend over the bridge insulating layer, and may be isolated from the semiconductor substrate. At least one pair of gate insulating layers may be between the at least one control gate electrode and the pair of fins, and at least one pair of storage nodes may be between the at least one pair of gate insulating layers and the at least one control gate electrode.

13 Claims, 9 Drawing Sheets

U.S. PATENT DOCUMENTS

| | | |
|---|---|---|
| 7,061,069 B2 * | 6/2006 | Mori et al. .................. 257/510 |
| 7,223,678 B2 * | 5/2007 | Noble et al. ................ 438/587 |
| 2004/0232496 A1 | 11/2004 | Chen et al. |
| 2005/0242391 A1 | 11/2005 | She et al. |
| 2005/0242406 A1 | 11/2005 | Hareland et al. |
| 2005/0253203 A1 | 11/2005 | Liaw |

FOREIGN PATENT DOCUMENTS

| | | |
|---|---|---|
| WO | WO 03/096425 A1 | 11/2003 |

* cited by examiner

NON-VOLATILE MEMORY DEVICE AND METHOD OF MANUFACTURING THE SAME

PRIORITY STATEMENT

This application claims priority under 35 USC §119 to Korean Patent Application Nos. 10-2006-0024903 and 10-2006-0113041, filed on Mar. 17, 2006 and Nov. 15, 2006 respectively, in the Korean Intellectual Property Office (KIPO), the entire contents of which are incorporated herein by reference.

BACKGROUND

1. Field

Example embodiments relate to a non-volatile memory device and a method of manufacturing the same. Other example embodiments relate to a non-volatile memory device having a fin-type channel region and a method of manufacturing the same.

2. Description of the Related Art

As the dimensions of semiconductor products decrease, the volume of data that has to be processed by semiconductor products is increasing. A method of increasing the operating speed and integration of non-volatile memory devices used in semiconductor products has been studied. For example, in the case of a semiconductor device having an increased integration by using a Fin-Field Effect Transistor (Fin-FET), the area of the channel may be enlarged to increase an operating speed and, at the same time, the width of the Fin may be decreased to increase the integration. A Fin-FET using a silicon-on-insulator (SOI) substrate may be considered as a possible method of further improving a short channel effect.

An SOI substrate may be relatively expensive. Therefore, attempts have been made to form a Fin-FET and/or a Fin memory cell using a bulk semiconductor substrate with a characteristic similar to that of an SOI substrate. However, the fins may need to be formed closer to each other for integration of the device to increase. Consequently, a reading disturbance may occur between adjacent fins. Even when the SOI substrate is used, a short channel effect, e.g., a drain induced barrier lowering (DIBL), may cause problems depending on the dielectric characteristics of an insulator.

SUMMARY

Example embodiments provide a non-volatile memory device less susceptible to reading disturbance and having an improved short channel effect.

Example embodiments also provide a method of manufacturing a non-volatile memory device less susceptible to reading disturbance and having an improved short channel effect.

According to example embodiments, a non-volatile memory device may include a semiconductor substrate having a body, and a pair of fins projecting from the body and spaced apart opposite each other and a bridge insulating layer non-electrically connecting upper portions of the pair of fins to define a void between the pair of fins.

Outer surfaces of the pair of fins are the surfaces of the pair of fins that do not face the void and inner surfaces of the pair of fins are the surfaces of the pair of fins that do face the void. The nonvolatile memory device may include at least one control gate electrode covering at least a portion of the outer surfaces of the pair of fins, extending over the bridge insulating layer, and isolated from the semiconductor substrate. At least one pair of gate insulating layers may be between the at least one control gate electrode and the pair of fins and at least one pair of storage nodes may be between the at least one pair of gate insulating layers and the at least one control gate electrode. The at least one control gate electrode may include a plurality of control gate electrodes, the at least one pair of gate insulating layers includes a plurality of pairs of gate insulating layers and the at least one pair of storage nodes includes a plurality of pairs of storage nodes. The bridge insulating layer may be on top of the pair of fins and the void may be defined between the bridge insulating layer and the pair of fins. The bridge insulating layer may extend to contact the upper portions of the inner surfaces of the pair of fins and the void may be defined between the bridge insulating layer and the pair of fins.

The device may further include a device isolation layer adjacent to lower portions of the outer surfaces of the pair of fins and between the at least one control gate electrode and the body. The at least one pair of gate insulating layers may be formed on the outer surfaces of the pair of fins. The at least one pair of gate insulating layers may be further formed on the top portions of the pair of fins. The nonvolatile memory device may further include at least one source region formed in the pair of fins on one side of the at least one control gate electrode and at least one drain region formed in the pair of fins on the other side of the at least one control gate electrode. The semiconductor substrate may be formed by etching a bulk semiconductor wafer. The at least one pair of gate insulating layers may be further formed on the upper ends of the pair of fins. The bridge insulating layer may be filled in upper end portions between the pair of fins, and the void may be defined between the bridge insulating layer and the pair of fins. The void may have a lower dielectric constant than that of an insulating layer. The pair of fins may not completely float from the body.

body.

According to example embodiments, a method of manufacturing a non-volatile memory device may include etching a semiconductor substrate to define a body and a pair of fins each projecting from the body and forming a bridge insulating layer connecting upper end portions of the pair of fins to define a void between the pair of fins. The method may further include forming gate insulating layers partially covering outer surfaces of the pair of fins which do not face the void, forming storage node layers covering the gate insulating layers, and forming a control gate electrode covering the storage node layers, and extending over the bridge insulating layer.

The bridge insulating layer may be further formed on the pair of fins and the body within the void, and the void may be defined within the bridge insulating layer. The bridge insulating layer may be formed by plasma enhanced chemical vapor deposition (PECVD). The bridge insulating layer may be filled in the upper end portion between the pair of fins, and the void may be defined between the bridge insulating layer and the pair of fins. The bridge insulating layer may extend over the upper end portions of the pair of fins, and the void may be defined between the bridge insulating layer and the pair of fins.

Defining the body and the pair of fins may further include forming a pair of first trenches in the semiconductor substrate, forming a device isolating layer filled in the first trenches and projecting from the semiconductor substrate, forming spacer insulating layers along the projecting sidewalls of the device isolating layer, and etching the semiconductor substrate exposed between the spacer insulating layers to define the pair of fins projecting from the body. The spacer insulating layers may include a nitride layer or an oxide layer and a nitride layer.

After defining the pair of fins, the method may further include forming a capping layer that connects the spacer insulating layers and defines the void between the pair of fins, wherein the bridge insulating layer comprises the spacer insulating layers and the capping layer. The capping layer may include a silicon nitride layer. The void may be defined by the capping layer without the spacer insulating layers. After forming the capping layer, the method may further include etching the device isolating layer to a predetermined depth to expose portions of outer surfaces of the pair of fins.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity.

It will be understood that when an element or layer is referred to as being "on," "connected to", "covering" or "coupled to" another element or layer, it can be directly on, connected, covering or coupled to the other element or layer or intervening elements or layers may be present. In contrast, when an element is referred to as being "directly on," "directly connected to", "directly covering" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The short channel effect may be universal in MOSFETs and may be defined as representing the gradual shorting together of the source and drain regions as the gate length reduces to relatively low values.

Figure 1:
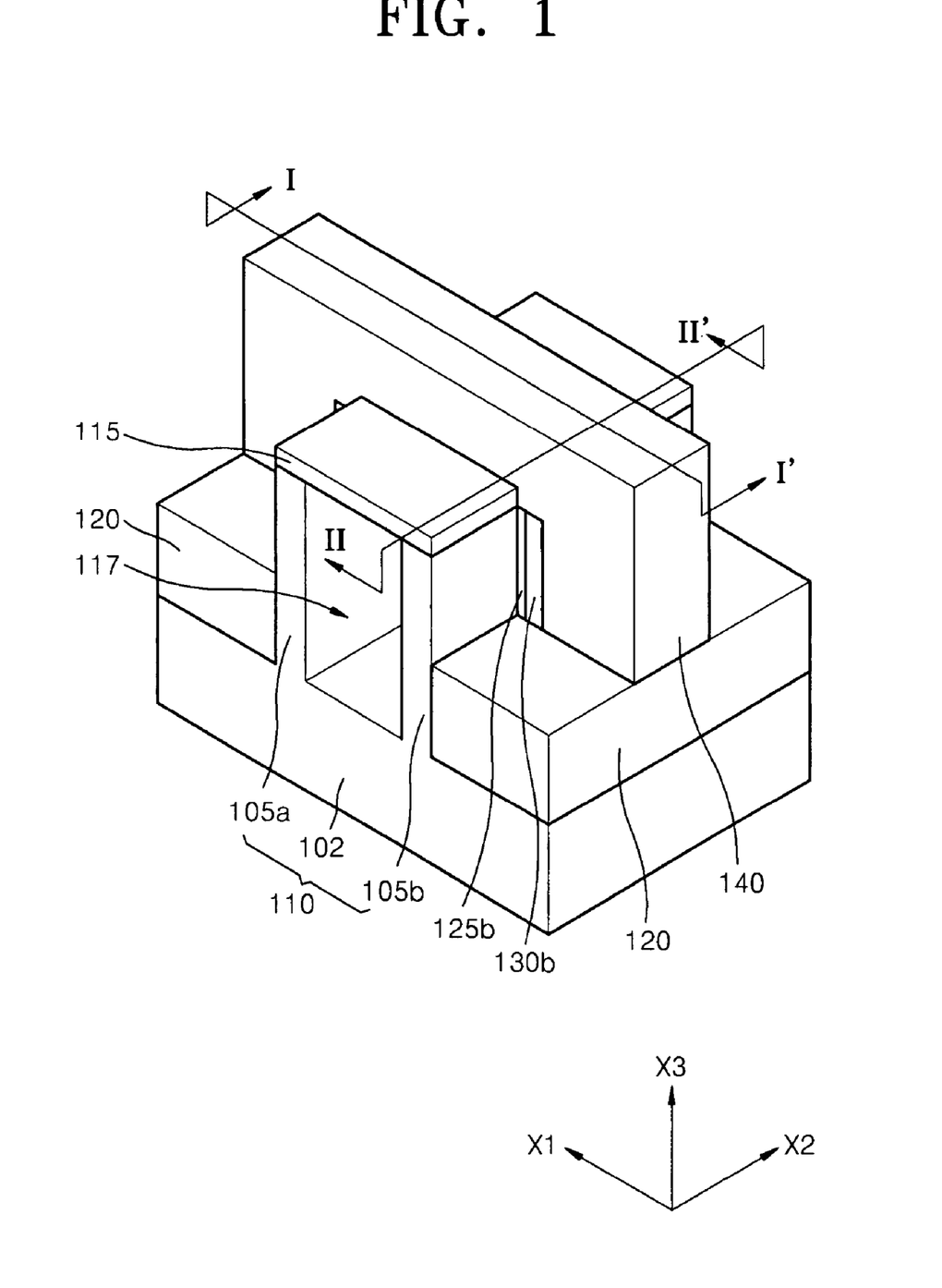
FIG. 1 is a diagram illustrating a non-volatile memory device according to example embodiments.
Figure 2:
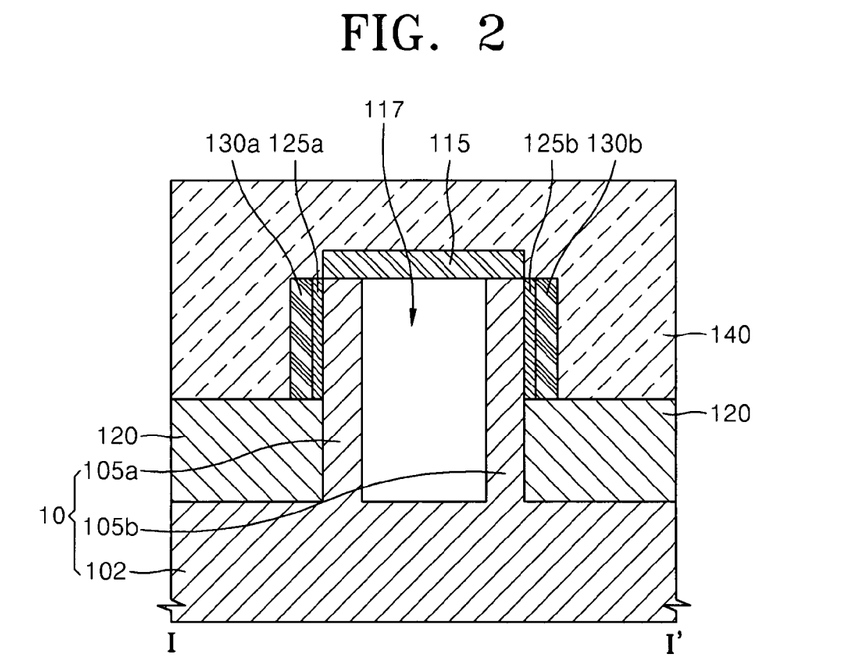
FIG. 2 is a diagram of the nonvolatile memory device illustrated in FIG. 1 taken along line I-I' of FIG. 1.
Figure 3:
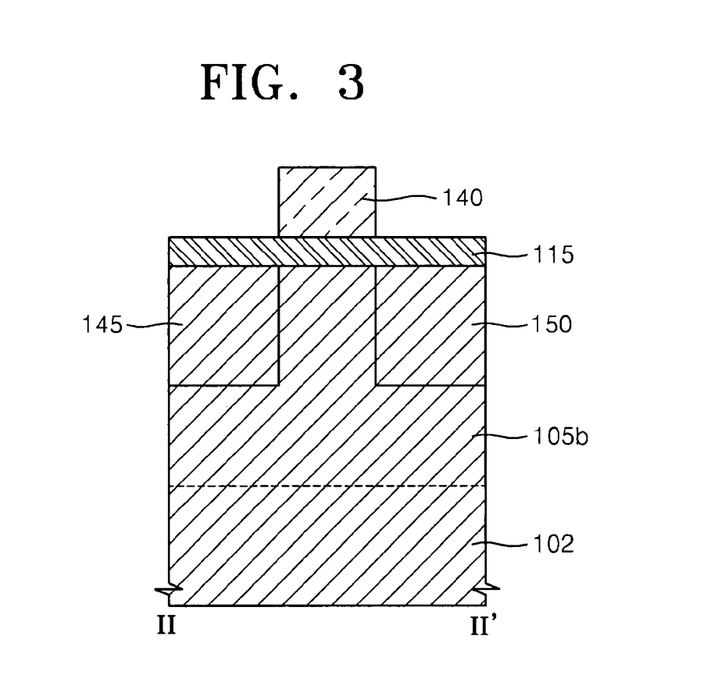
FIG. 3 is a diagram of the nonvolatile memory device illustrated in FIG. 1 taken along line II-II' of FIG. 1.

FIG. 1 is a diagram illustrating a non-volatile memory device according to example embodiments. FIG. 2 is a diagram of the nonvolatile memory device illustrated in FIG. 1 taken along line I-I' of FIG. 1, and FIG. 3 is a diagram of the nonvolatile memory device illustrated in FIG. 1 taken along line II-II' of FIG. 1. The non-volatile memory device according to example embodiments illustrates a unit cell structure. For example, the unit cell structure may be used for a flash memory and/or a Silicon-Oxide-Nitride-Oxide-Silicon (SONOS) memory. The unit cell structure may form a NAND cell array structure and/or a NOR cell array structure.

Referring to FIGS. 1-3, the non-volatile memory device may include a semiconductor substrate 110, a bridge insulating layer 115, a pair of gate insulating layers 125a and 125b, a pair of storage nodes 130a and 130b and a control gate electrode 140. A device isolation layer 120 may be further provided. Hereinafter, a structure of the non-volatile memory device will be described in more detail.

The semiconductor substrate 110 may include a body 102 and a pair of fins 105a and 105b oppositely spaced from each other by projecting from the body 102. For example, the fins 105a and 105b may be spaced opposite each other in an X1 direction, and extending along an X2 direction. The semiconductor substrate 110 may be formed by etching a bulk semiconductor wafer, e.g., a bulk silicon wafer and/or a bulk silicon-germanium wafer. The fins 105a and 105b may be formed of a material identical to that of the body 102.

The bridge insulating layer 115 may non-electrically connect upper ends of the fins 105a and 105b to define a void 117 between the pair of fins 105a and 105b. The bridge insulating layer 115 may extend over the upper ends of the fins 105a and 105b. By doing so, the void 117 may be defined between the fins 105a and 105b and the bridge insulating layer 115. In example embodiments, the void 117 may denote a hollow space filled with air. The bridge insulating layer 115 may include, e.g., a silicon oxide layer and/or a silicon nitride layer.

The void 117 may be defined in various ways. For example, a buried insulating layer (not shown) may be formed between the fins 105a and 105b, and the bridge insulating layer 115 that covers the upper ends of the fins 105a and 105b may be formed. The buried insulating layer may be selectively removed with respect to the bridge insulating layer 115, thereby forming the void 117. In another example, referring to FIGS. 9-11, spacer insulating layers 155 may be formed on sidewalls of the device isolation layer 120a projecting from the semiconductor substrate 110. Using the spacer insulating layers 155 as an etch mask, the semiconductor substrate 110, exposed between the spacer insulating layers 155, may be etched to form a second trench 160. Therefore, a pair of fins 105a and 105b projecting from a body 102 of the semiconductor substrate 110 may be defined. A non-conductive capping layer 157, connecting the spacer insulating layers 155, may be formed to define a void 117a between the pair of fins 105a and 105b.

The control gate electrode 140 may be on at least one portion of outer surfaces of the facing fins 105a and 105b in which inner surfaces are those facing the void 117 and may traverse over the bridge insulating layer 115. The control gate electrode 140 may be isolated from the semiconductor substrate 110. For example, the control gate electrode 140 may be on upper portions of the outer surfaces of the fins 105a and 105b exposed by the device isolation layer 120. The device isolation layer 120 may include a silicon oxide layer and/or a silicon nitride layer.

The control gate electrode 140 may be electrically isolated from the fins 105a and 105b by the gate insulating layers 125a and 125b and/or the storage nodes 130a and 130b and may be electrically isolated from the body 102 by the device isolation layer 120. For example, the control gate electrode 140 may include polysilicon, a metal, metal silicide and/or a composite layer of these materials.

The gate insulating layers 125a and 125b may be interposed between the control gate electrode 140 and the fins 105a and 105b, respectively. For example, the gate insulating layers 125a and 125b may be respectively formed on the upper portions of the outer surfaces of the fins 105a and 105b. The gate insulating layers 125a and 125b may act as tunneling insulating layers because they may be used as a tunneling path for charges. The gate insulating layers 125a and 125b may be formed of, for example, silicon oxide, silicon nitride, a high dielectric constant material and/or a composite of these materials.

The storage nodes 130a and 130b may be respectively interposed between the gate insulating layers 125a and 125b and the control gate electrode 140. For example, the storage nodes 130a and 130b may be formed to cover the upper portions of the outer surfaces of the fins 105a and 105 and may be formed on outer surfaces of the gate insulating layers 125a and 125b. The storage nodes 130a and 130b may be used for storing charges. A flash memory may use a floating gate layer, and a SONOS memory may use a charge trapping layer.

The storage nodes 130a and 130b may include polysilicon, silicon germanium, silicon and/or metal dots, silicon and/or metal nano-crystals, and/or a silicon nitride layer. The storage nodes 130a and 130b composed of polysilicon and/or silicon germanium may be used as floating charge storing films. The storage nodes 130a and 130b including silicon and/or metal dots, silicon and/or metal nano-crystals, and/or a silicon nitride layer may be used as trap charge storing films.

A source region 145 may be formed in the fins 105a and 105b on one side of the control gate electrode 140 and a drain region 150 may be formed in the fins 105a and 105b on the other side of the control gate electrode 140. The source region 145 and the drain region 150 may be formal classifications, and as such they may be freely changed. The source region 145 and the drain region 150 may be diode-junctioned to the body 102 and/or the other portions of the fins 105a and 105b other than the source region 145 and the drain region 150. For example, when the source region 145 and the drain region 150 are doped with an n-type impurity, the other portion of the pair of fins 105a and 105b other than the source region 145 and the drain region 150 and/or the body 102 may be doped with a p-type impurity.

The non-volatile memory device may further include a blocking insulating layer (not shown) between the control gate electrode 140 and the storage nodes 130a and 130b. When the storage nodes 130a and 130b are composed of a conductive material (e.g., polysilicon and/or silicon-germanium), the blocking insulating layer may be included. The blocking insulating layer may be, e.g., a silicon oxide layer.

Hereinafter, operating characteristics of the non-volatile memory device according to example embodiments will be described. In the foregoing non-volatile memory device, a depletion region formed in the portion of the fins 105a and 105b around the source region 145 and the drain region 150 may be limited. As the fins 105a and 105b are relatively narrow, the depletion region may be further limited. The depletion region may be limited due to the existence of the void 117 in the width direction, e.g., the X1 direction as shown on FIG. 1, and as such will only be formed along the X3 direction. If the width of the fins 105a and 105b is decreased, an influence of the depletion region formed along the X3 direction may be decreased. It should be noted that the void 117 may have a dielectric constant lower than that of any insulating layer, for example, SiN or a low K dielectric.

The potential and depletion in the fins 105a and 105b portions (that may be referred to as channel regions) between the source region 145 and the drain region 150 may be affected by the void 117. Such an arrangement of the fins 105a and 105b and the void 117 may be compared with that of the conventional SOI structure, and may be referred to as a Silicon-On-Void (SOV) structure.

The structure according to example embodiments may be distinct from the SOV structure employed in a conventional planar transistor structure. The current structure may be a SOV-like structure. The conventional SOV structure may be disposed in the vertical direction, e.g., the X3 direction, but the SOV-like structure according to example embodiments may be disposed in the horizontal direction, e.g., the X1 direction. In the SOV-like structure according to example embodiments, the fins 105a and 105b may not be completely floated from the body 102, unlike the conventional SOV structure.

The SOV structure and/or the SOV-like structure may reduce the short channel effect that may occur due to expansion of the depletion region. An off-current and a junction leakage current may be decreased, and a Drain Induced Barrier Lowering (DIBL) effect may be improved. The advantage of supplying a body-bias to the fins 105a and 105b by supplying a voltage to the body 102 may be maintained.

Figure 5:
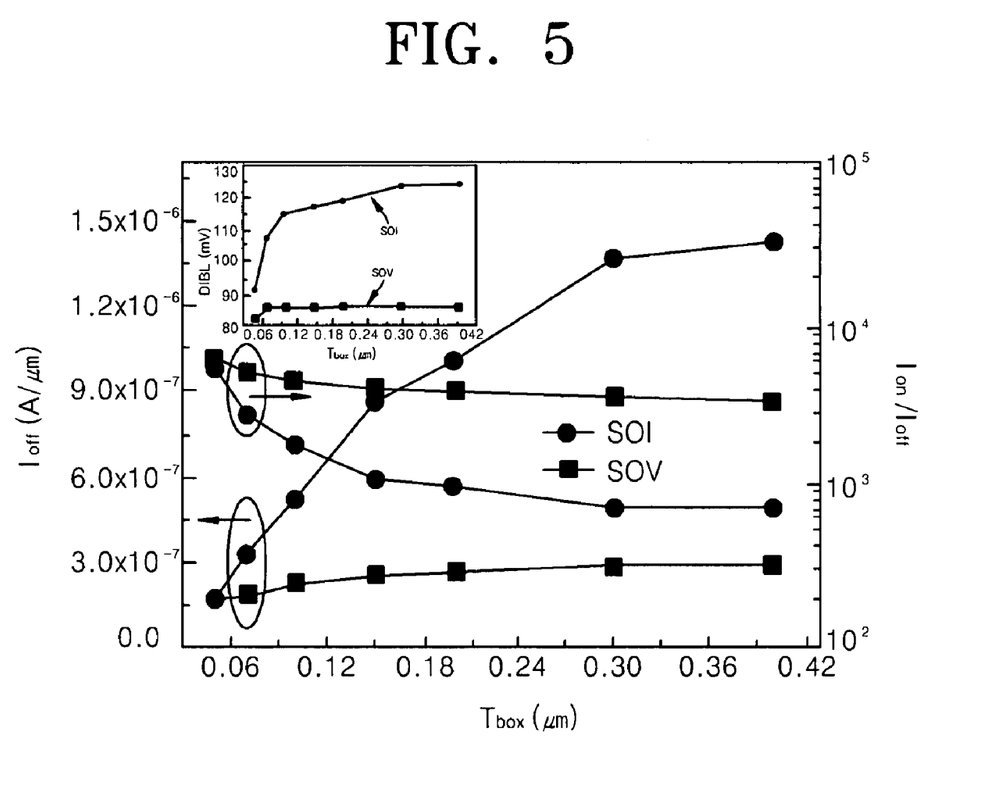
FIG. 5 is a graph illustrating electrical characteristics of an SOI structure and an SOV structure.

FIG. 5 is a graph illustrating electrical characteristics of an SOI structure and an SOV structure. In FIG. 5, a plot representing the SOV structure may be obtained by using the SOV structure in a planar transistor structure, which indirectly illustrates the advantages of the SOV-like structure according to example embodiments. Referring to FIG. 5, the SOV structure may have a lower off-current value and a higher on-current value than those of the SOI structure. As may be noted in the inserted graph of FIG. 5, the SOV structure may have lower DIBL values than the SOI structure. The void may have a lower dielectric constant than an insulator. It may be expected from the above results that the non-volatile memory device having the SOV-like structure according to example embodiments may have an improved short channel effect, e.g., a lower off-current, a higher on-current and a lower DIBL value.

In the non-volatile memory device according to example embodiments, the fins 105a and 105b may be used as bit lines, and the control gate electrode 140 may be used as a word line. The storage nodes 130a and 130b may be used as the charge storage layers. When the fins 105a and 105b are disposed adjacent to each other, the charges stored in the storage nodes 130a and 130b may cause reading disturbance. For example, adjacent charges stored in the left storage node 130a may vary a potential of the right fin 125b, which may disturb the reading of the state of the right storage node 130b, and vice versa. Because the void 117, e.g., air, has a dielectric constant lower than any insulator, the reading disturbance problem may be alleviated. The SOV structure and/or the SOV-like structure may increase reliability of the reading operation compared to the conventional SOI structure.

Figure 4:
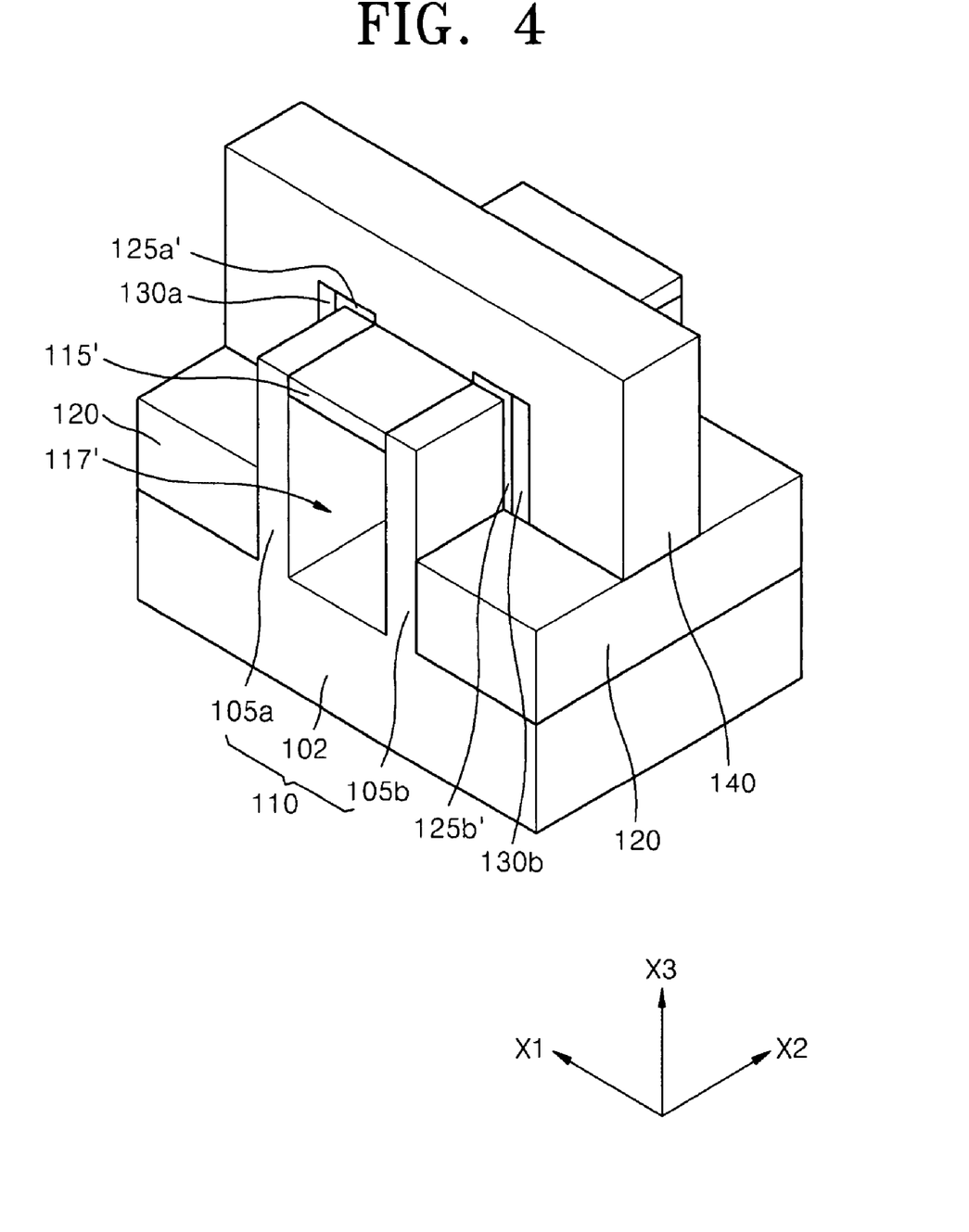
FIG. 4 is a diagram illustrating a non-volatile memory device according to other example embodiments.

FIG. 4 is a diagram illustrating a non-volatile memory device according to other example embodiments. The non-volatile memory device shown in FIG. 4 may be a slightly modified version of that shown in FIG. 1. The description of the non-volatile memory device that was illustrated with reference to FIGS. 1-3 may also apply to the non-volatile memory device illustrated in FIG. 4, and thus repeated portions will not be described. In example embodiments, like reference numerals in the drawings denote like elements.

Referring to FIG. 4, a bridge insulating layer 115' may be formed to fill a space between upper portions of inner surfaces of fins 105a and 105b. By doing so, the void 117' may be defined below the bridge insulating layer 115' and between the fins 105a and 105b. For example, when an insulating layer is formed between relatively narrowly separated fins 105a and 105b by Physical Vapor Deposition (PVD), the bridge insulating layer 115' connecting only the upper ends of the fins 105a and 105b due to undesirable step coverage may be formed.

Because the top of the fins 105a and 105b are not covered by the bridge insulating layer 115' and are thus exposed, gate insulating layers 125a' and 125b' may extend on outer surfaces of the fins 105a and 105b, e.g., on the top of the fins 105a and 105b as well as upper portions of outer surfaces of the fins 105a and 105b.

The non-volatile memory device according to example embodiments may have the same characteristics as the non-volatile memory device according to the foregoing example embodiments.

Figure 6:
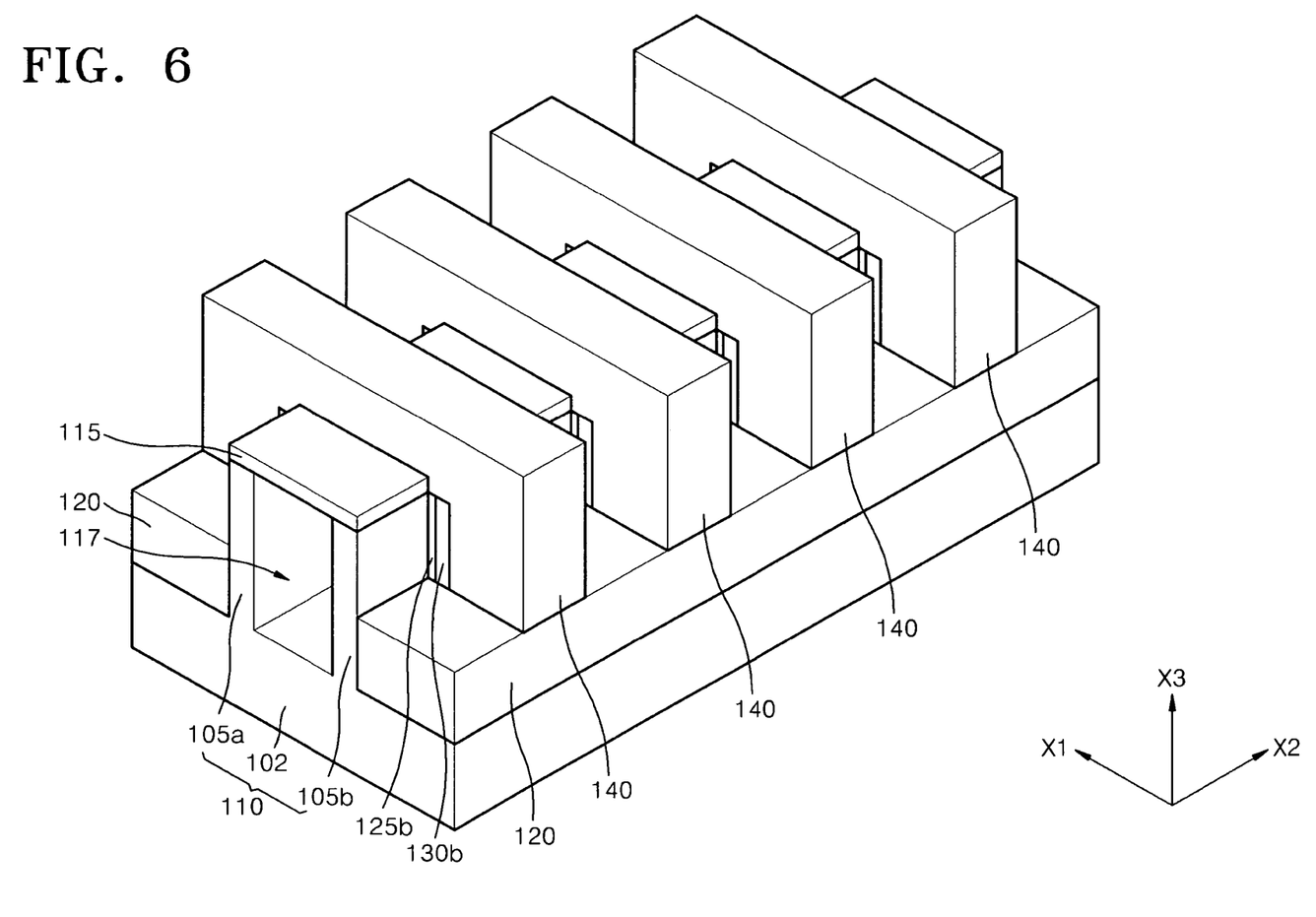
FIG. 6 is a perspective diagram illustrating a non-volatile memory device according to other example embodiments.

FIG. 6 is a diagram illustrating a non-volatile memory device according to other example embodiments. The non-volatile memory device illustrated in FIG. 6 may be obtained by connecting a plurality of the non-volatile memory devices illustrated in FIG. 1 in a NAND structure. Description with respect to portions repeated in previous example embodiments may not be repeated, and like reference numerals in the drawings denote like elements.

Referring to FIG. 6, a plurality of control gate electrodes 140 may extend to cover opposite sides of a void 117, upper portions of outer surfaces of fins 105a and 105b and bridge insulating layers 115 which are formed to extend between upper ends of the fins 105a and 105b. The plurality of gate electrodes 140 may be spaced apart from one another. A plurality of gate insulating layers 125a and 125b may be respectively interposed between the control gate electrodes 140 and the fins 105a and 105b. A plurality of storage nodes 130a and 130b may be interposed between the control gate electrodes 140 and the gate insulating layers 125a and 125b, respectively.

In the NAND structure, the source region 145 of FIG. 3 and the drain region 150 of FIG. 3 may be alternately formed in the respective fins 105a and 105b between respective control gate electrodes 140. The order of the source region and the drain region may not be fixed and may be reversed. In FIG. 6, the number of control gate electrodes 140 shown may be for illustrative purposes, and the scope of example embodiments may not be limited to such a number. The pair of fins 105a and 105b may be illustrated in FIG. 6, but a plurality of pairs of fins (not shown) may be further disposed in a column direction. The control gate electrodes disposed in the same row may be connected to one another.

Although the memory device illustrated in FIG. 1 is utilized in a NAND structure of FIG. 6, the non-volatile memory device illustrated in FIG. 4 may also be utilized in a NAND structure.

FIGS. 7-13 are diagrams illustrating a non-volatile memory device and a method of manufacturing the same according to example embodiments.

Figure 7:
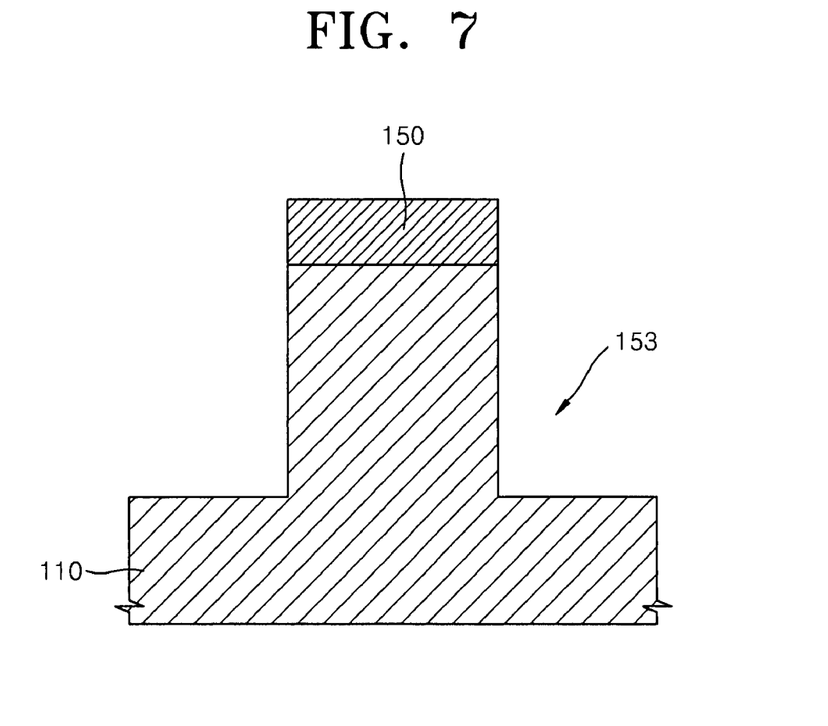
FIGS. 7 through 13 are perspective diagrams illustrating a non-volatile memory device and a method of fabricating the same according to other example embodiments.

Referring to FIG. 7, at least a pair of first trenches 153 may be formed in a semiconductor substrate 110. For example, a hard mask layer 150 may be formed on the semiconductor substrate 110. Then, using the hard mask layer 150 as an etch mask, exposed portions of the semiconductor substrate 110 may be etched to form the first trenches 153. The hard mask layer 150 may include a nitride layer and/or an oxide layer.

Figure 8:
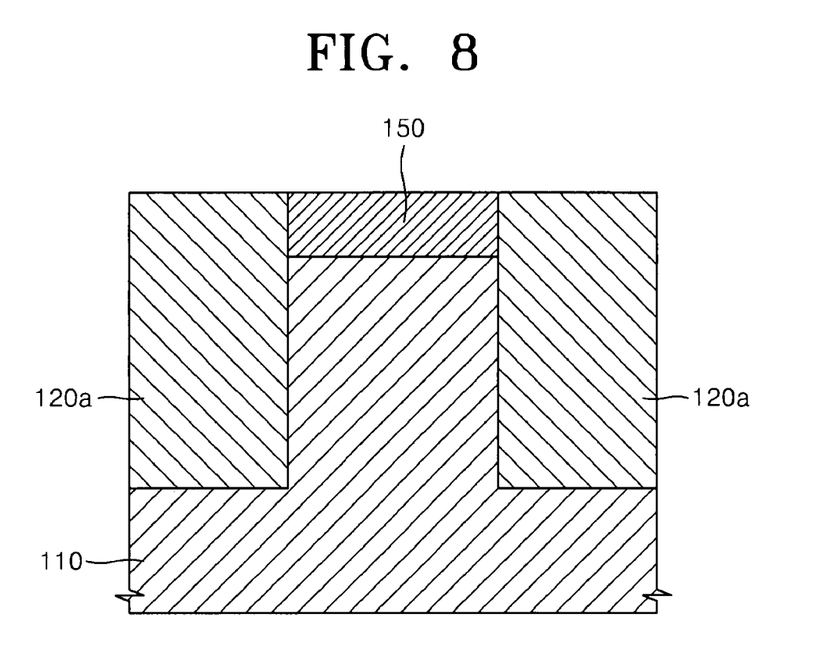

Referring to FIG. 8, a device isolating layer 120a may be at least filled in the first trenches 153. For example, the device isolating layer 120a may be filled in the first trenches 153, and then planarized until the hard mask layer 150 is exposed.

Therefore, the device isolating layer 120a may be filled in the first trenches 153 to project onto the semiconductor substrate 100.

Figure 9:
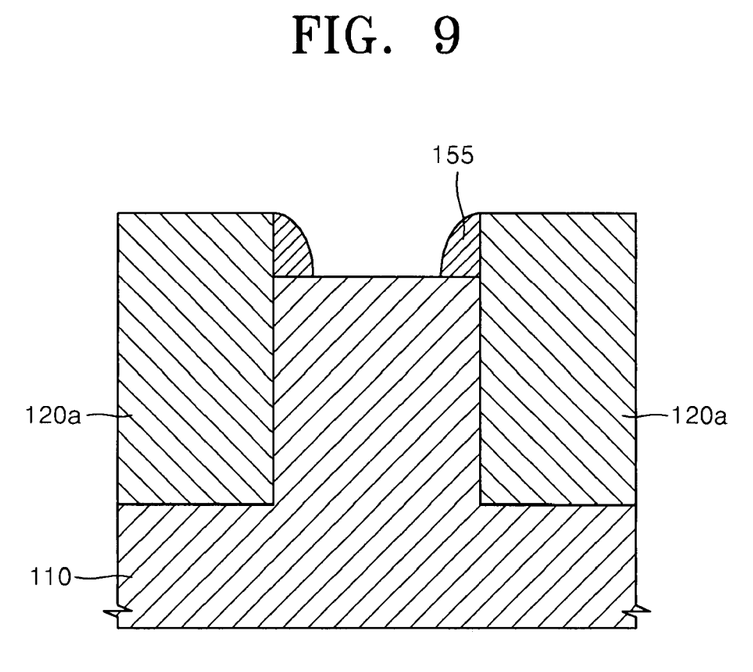

Referring to FIG. 9, the hard mask layer 150 may be removed, and spacer insulating layers 155 may be formed on sidewalls of the device isolating layer 120a projecting from the semiconductor substrate 110. Each of the spacer insulating layers 155 may have a width adjusted to partially expose the semiconductor substrate 110 between them. For example, the spacer insulating layers 155 may be formed such that predetermined or given insulating layers are deposited and then anisotropically etched. The spacer insulating layers 155 may include a nitride layer, and may further include an oxide layer added under the nitride layer.

Figure 10:
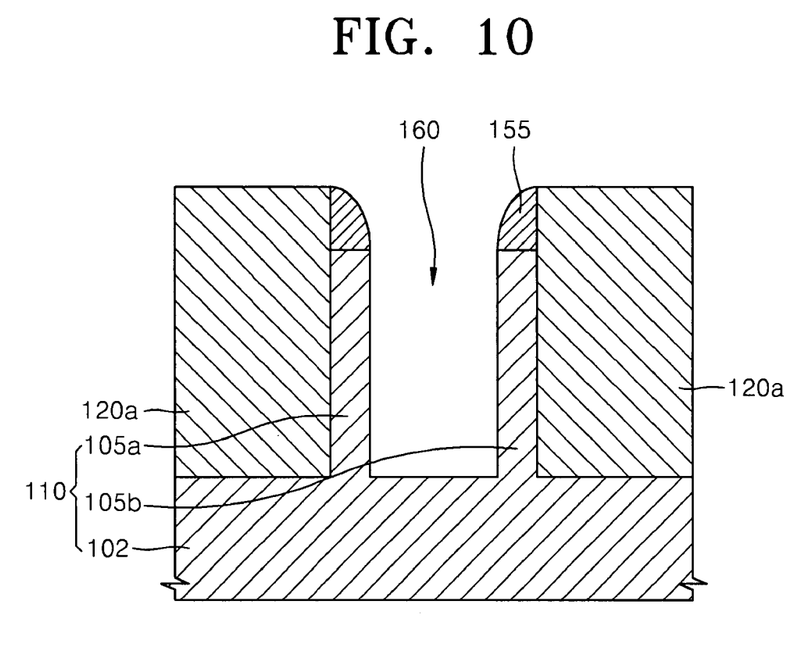

Referring to FIG. 10, using the spacer insulating layers 155 as an etch mask, the semiconductor substrate 110, exposed between the spacer insulating layers 155, may be etched to form a second trench 160. Therefore, a pair of fins 105a and 105b projecting from a body 102 of the semiconductor substrate 110 may be defined. The first and second trenches 153 and 160 may have an equal depth or depths different from each other.

Figure 11:
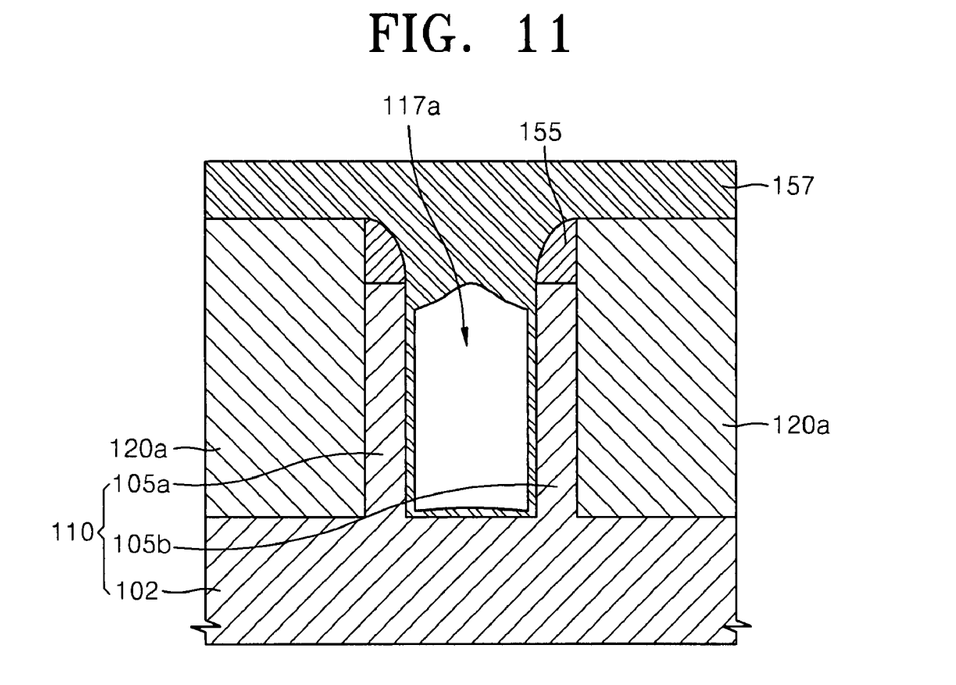

Referring to FIG. 11, a non-conductive capping layer 157, connecting the spacer insulating layers 155, may be formed to define a void 117a between the pair of fins 105a and 105b. The capping layer 157 may be formed using a deposition method with undesirable step coverage, so that the capping layer 157 may connect the spacer insulating layers 155 without filling in a space between the pair of fins 105a and 105b.

For example, the capping layer 157 may include a silicon nitride layer, and may be formed by plasma enhanced chemical vapour deposition (PECVD). The capping layer 157 may be thickly grown on the spacer insulating layers 155 but slightly grown or not grown on bottoms and sidewalls of the pair of fins 105a and 105b. Therefore, the capping layer 157 may connect the spacer insulating layers 155 before filling in the space between the pair of fins 105a and 105b. The capping layer 157 may connect upper ends of the fins 105a and 105b in view of the aspect ratio of the second trench 160.

If the capping layer 157 is slightly grown on the bottom and the sidewalls of the fins 105a and 105b, the void 117a may be defined within the capping layer 157. However, when the aspect ratio of the second trench 160 is greater, the capping layer 157 may not be grown on the sidewalls of the fins 105a and 105b. The void 117a may be defined between the fins 105a and 105b and the capping layer 157 or by fins 105a and 105b, the spacer insulating layers 115 and the capping layer 157.

Figure 12:
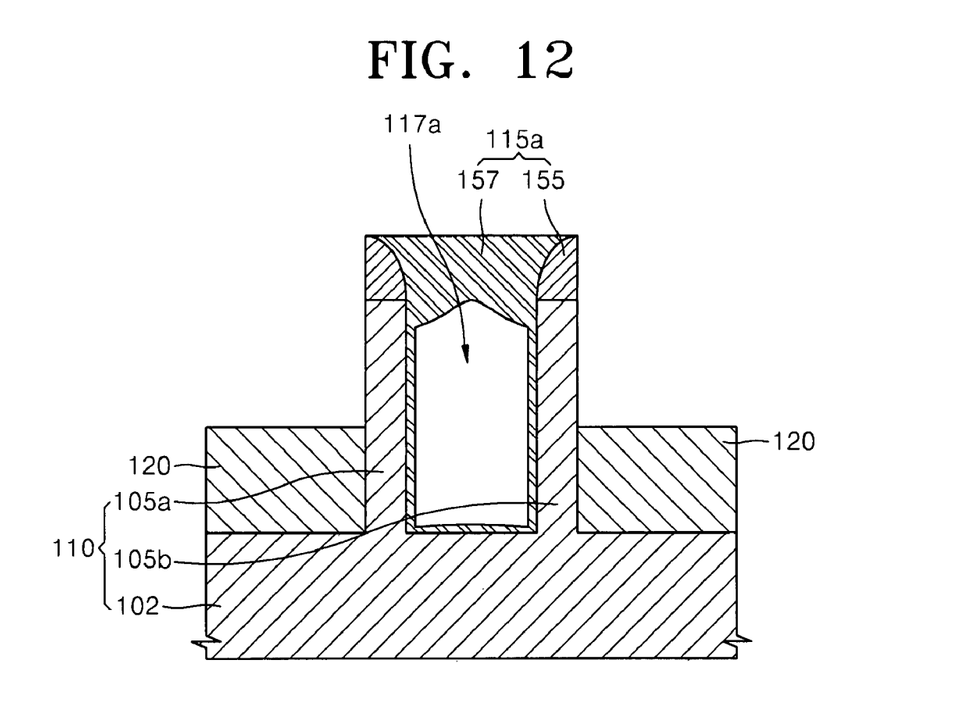

Referring to FIG. 12, the capping layer 157 may be optionally planarized to define a bridge insulating layer 115a. For example, planarization may be performed using etch back and/or chemical mechanical planarization (CMP). The bridge insulating layer 115a may include the spacer insulating layers 155 and the capping layer 157. Therefore, the void 117a may be defined between the bridge insulating layer 115a and fins 105a and 105b. A device isolating layer 120 may be formed to expose portions of the fins 105a and 105b, e.g., the upper end portions. For example, the device isolating layer 120a projecting from the semiconductor substrate 110 may be etched to a predetermined or given thickness, thereby forming the device isolating layer 120.

Figure 13:
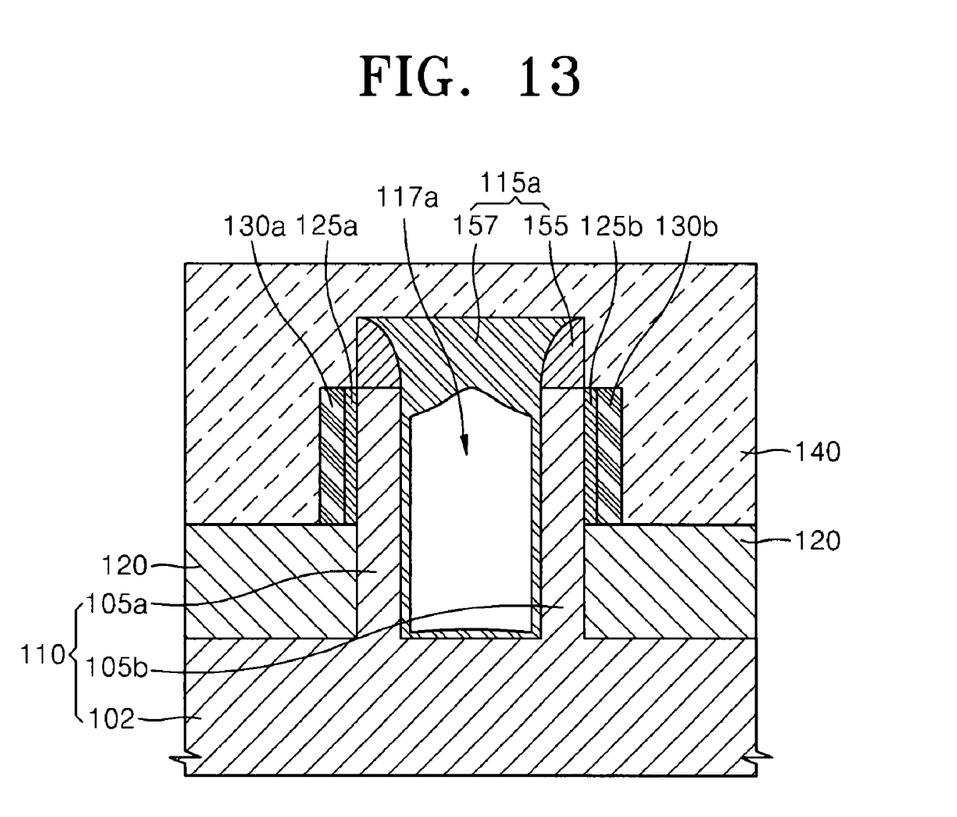

Referring to FIG. 13, gate insulating layers 125a and 125b may be formed on portions of the fins 105a and 105b, which do not face the void 117a. For example, the gate insulating layers 125a and 125b may be formed on the upper portions of the fins 105a and 105b exposed from the device isolating layer 120 using thermal oxidation and/or chemical vapour deposition. If chemical vapour deposition is used, the gate insulating layers 125a and 125b may be connected to each other over the bridge insulating layer 115a.

The storage node layers 130a and 130b may be formed to cover the gate insulating layers 125a and 125b. For example, the storage node layers 130a and 130b may be shaped as spacers that cover the gate insulating layers 125a and 125b and may be separated from each other. Alternatively, the storage node layers 130a and 130b may cover the gate insulating layers 125a and 125b and be connected to each other over the bridge insulating layer 115a.

A control gate electrode 140 may cover the storage node layers 130a and 130b, and may extend onto the bridge insulating layer 115a. Before forming the control gate electrode 140, a blocking insulating layer (not shown) may be further disposed to cover the storage node layers 130a and 130b. The control gate electrode 140 may be insulated from the body 102 of the semiconductor substrate 110 by the device isolating layer 120. Therefore, according to example embodiments, the non-volatile memory device having the SOV structure may be economically manufactured using conventional manufacturing processing.

In example embodiments, the bridge insulating layer 115a may correspond to the bridge insulating layer 115 of the non-volatile memory device described with reference to FIGS. 1-3. Accordingly, the description of operational characteristics of the non-volatile memory device that was illustrated with reference to FIGS. 1-3 may also apply to that of FIGS. 7-13. However, in the non-volatile memory device of FIGS. 7-13, the capping layer may not have a uniform thickness as the control gate electrode in FIGS. 1-3. The method of manufacturing the non-volatile memory device according to FIGS. 7-13 may be applied to the NAND structure illustrated in FIG. 6.

As a modified version of example embodiments, the fins 105a and 105b may be formed without using the spacer insulating layers 155 illustrated in FIGS. 9 and 10. For example, in FIGS. 7 and 8, the first and second trenches 153 and 160 may be formed consecutively or at one time using conventional photolithography or etching to define the fins 105a and 105b projecting from the body 102. In FIGS. 11-13, the bridge insulating layer 115a may define the void 117a by the capping layer 157 solely, without requiring the spacer insulating layers 155. The bridge insulating layer 115a may correspond to the structure described with reference to FIG. 4.

A non-volatile memory device according to example embodiments may have an SOV-like structure and an improved short channel effect. For example, an off-current and a junction leakage current may be decreased, an on-current may be increased and a Drain Induced Barrier Lowering (DIBL) effect may be improved. Nevertheless, the advantage of supplying a body-bias to the fins by supplying a voltage to the body is maintained.

Furthermore, the non-volatile memory device according to example embodiments may include increased reading reliability by decreasing a reading disturbance compared to the conventional SOI structure.

Although example embodiments have described the void as being filled with air, the void may be filled with any single gas or combination of gases. Additionally, in example embodiments, the void may be in a partial or complete vacuum state.

While example embodiments have been particularly shown and described with reference to example embodiments thereof, it will be understood by those of ordinary skill in the art that various changes in form and details may be made therein without departing from the spirit and scope of the following claims.

What is claimed is:

1. A non-volatile memory device comprising:
   a semiconductor substrate having a body, and a pair of fins projecting from the body and spaced apart opposite each other; and
   a bridge insulating layer non-electrically connecting upper portions of the pair of fins to define a void between the pair of fins,
   at least one control gate electrode covering at least a portion of the outer surfaces of the pair of fins, extending over the bridge insulating layer, and isolated from the semiconductor substrate;
   at least one pair of gate insulating layers between the at least one control gate electrode and the pair of fins; and
   at least one pair of storage nodes between the at least one pair of gate insulating layers and the at least one control gate electrode,
   wherein outer surfaces of the pair of fins are the surfaces of the pair of fins that do not face the void and inner surfaces of the pair of fins are the surfaces of the pair of fins that do face the void.

2. The non-volatile memory device of claim 1, wherein the at least one control gate electrode includes a plurality of control gate electrodes, the at least one pair of gate insulating layers includes a plurality of pairs of gate insulating layers and the at least one pair of storage nodes includes a plurality of pairs of storage nodes.

3. The non-volatile memory device of claim 1, wherein the bridge insulating layer is on top of the pair of fins, and the void is defined between the bridge insulating layer and the pair of fins.

4. The non-volatile memory device of claim 1, wherein the bridge insulating layer extends to contact the upper portions of the inner surfaces of the pair of fins, and the void is defined between the bridge insulating layer and the pair of fins.

5. The non-volatile memory device of claim 1, further comprising:
   a device isolation layer adjacent to lower portions of the outer surfaces of the pair of fins and between the at least one control gate electrode and the body.

6. The non-volatile memory device of claim 1, wherein the at least one pair of gate insulating layers are formed on the outer surfaces of the pair of fins.

7. The non-volatile memory device of claim 6, wherein the at least one pair of gate insulating layers are further formed on the top portions of the pair of fins.

8. The non-volatile memory device of claim 1, further comprising:
   at least one source region formed in the pair of fins on one side of the at least one control gate electrode and at least one drain region formed in the pair of fins on the other side of the at least one control gate electrode.

9. The non-volatile memory device of claim 1, wherein the semiconductor substrate is formed by etching a bulk semiconductor wafer.

10. The non-volatile memory device of claim 6, wherein the at least one pair of gate insulating layers are further formed on the upper ends of the pair of fins.

11. The non-volatile memory device of claim 8, wherein the bridge insulating layer is filled in upper end portions between the pair of fins, and the void is defined between the bridge insulating layer and the pair of fins.

12. The non-volatile memory device of claim 1, wherein the void has a lower dielectric constant than that of an insulating layer.

13. The non-volatile memory device of claim 1, wherein the pair of fins are not completely floating from the body.

* * * * *